(12) United States Patent
Jeong

(10) Patent No.: US 10,719,095 B2
(45) Date of Patent: Jul. 21, 2020

(54) VOLTAGE CLAMPING CIRCUIT, SEMICONDUCTOR APPARATUS, AND SEMICONDUCTOR SYSTEM INCLUDING THE VOLTAGE CLAMPING CIRCUIT

(71) Applicant: SK hynix Inc., Icheon-si, Gyeonggi-do (KR)

(72) Inventor: Sang Hoon Jeong, Yeoju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 16 days.

(21) Appl. No.: 16/210,262

(22) Filed: Dec. 5, 2018

(65) Prior Publication Data

US 2019/0384336 A1  Dec. 19, 2019

(30) Foreign Application Priority Data

Jun. 18, 2018  (KR) .................. 10-2018-0069566

(51) Int. Cl.
| | | |
|---|---|---|
| *G05F 1/00* | (2006.01) | |
| *G05F 1/565* | (2006.01) | |
| *G01R 19/165* | (2006.01) | |
| *G05F 1/46* | (2006.01) | |
| *H03K 3/356* | (2006.01) | |

(52) U.S. Cl.
CPC ....... *G05F 1/565* (2013.01); *G01R 19/16552* (2013.01); *G05F 1/465* (2013.01); *H03K 3/356008* (2013.01)

(58) Field of Classification Search
CPC . G05F 1/565; G05F 1/465; G05F 1/00; G05F 1/10; G05F 1/12; G05F 1/46; G05F 1/455
See application file for complete search history.

(56) References Cited

U.S. PATENT DOCUMENTS

2008/0048729 A1* 2/2008 Ehrenreich ......... G03F 7/70516
 327/63
2019/0190256 A1* 6/2019 Agarwal ................ H02H 9/046

FOREIGN PATENT DOCUMENTS

KR         100854419 B1     8/2008
KR      1020140148094 A    12/2014

* cited by examiner

*Primary Examiner* — Adolf D Berhane
*Assistant Examiner* — Afework S Demisse
(74) *Attorney, Agent, or Firm* — William Park & Associates Ltd.

(57) ABSTRACT

A voltage clamping circuit includes a first detection circuit, a second detection circuit, and a discharge circuit. The first detection circuit detects a voltage level of a power voltage during a first operation period of a semiconductor apparatus. The second detection circuit detects the voltage level of the power voltage during a second operation period of the semiconductor apparatus. The discharge circuit changes the voltage level of the power voltage based on the detection results of the first and second detection circuits.

18 Claims, 6 Drawing Sheets

VOLTAGE CLAMPING CIRCUIT, SEMICONDUCTOR APPARATUS, AND SEMICONDUCTOR SYSTEM INCLUDING THE VOLTAGE CLAMPING CIRCUIT

CROSS-REFERENCES TO RELATED APPLICATION

The present application claims priority under 35 U.S.C. § 119(a) to Korean application number 10-2018-0069566, filed on Jun. 18, 2018, in the Korean Intellectual Property Office, which is incorporated herein by reference in its entirety.

BACKGROUND

1. Technical Field

Various embodiments of the present disclosure relate to a semiconductor technology and, more particularly, to a voltage clamping circuit, a semiconductor apparatus including the voltage clamping circuit, and a semiconductor system including the voltage clamping circuit.

2. Related Art

An electronic device includes many electronic elements, and a computer system includes many semiconductor apparatuses each including a semiconductor. The semiconductor apparatuses of a computer system operate by receiving power voltages from a power voltage supply circuit, such as a Power Management Integrated Circuit (PMIC). The power voltages are regulated to have certain levels by the PMIC and then provided to the semiconductor apparatuses. However, a voltage surge, a voltage spike, noise, overshooting, and undershooting during switching and so forth may occur anytime in the power voltages. The voltage surge, the voltage spike, the noise, the overshooting, and the undershooting and so forth are uncontrollable and may cause electrical stress and thermal damage to electronic circuits configuring a semiconductor apparatus.

In general, a semiconductor apparatus alleviates the electrical stress imposed on its electronic circuits due to drastic change of the power voltage through a protection circuit provided therein, such as an electromagnetic interference (EMI) circuit, an electrostatic discharge (ESD) circuit, an electrical over-stress (EOS) circuit, and so forth. Such circuits need to be preceded to precisely detect the change of the power voltage in order to efficiently prevent the electrical stress.

SUMMARY

In an embodiment of the present disclosure, a voltage clamping circuit may include a first detection circuit, a second detection circuit, a selection circuit, and a discharge circuit. The first detection circuit may be configured to generate a first detection signal by detecting a level of a power voltage. The second detection circuit may be configured to generate a second detection signal by detecting the level of the power voltage. The selection circuit may be configured to output one of the first detection signal and the second detection signal as a voltage detection signal based on a power-up signal. The discharge circuit may be configured to change the level of the power voltage based on the voltage detection signal.

In an embodiment of the present disclosure, a semiconductor apparatus may include a voltage clamping circuit and an internal circuit. The voltage clamping circuit may be configured to generate a voltage detection signal by detecting a level of a power voltage during a first operation period of the semiconductor apparatus, generate the voltage detection signal by comparing the power voltage with a reference voltage during a second operation period of the semiconductor apparatus, and change the level of the power voltage based on the voltage detection signal. The internal circuit may be configured to operate by receiving the power voltage.

In an embodiment of the present disclosure, a semiconductor system may include a first semiconductor apparatus, a second semiconductor apparatus, and a power management integrated circuit. The first semiconductor apparatus may be configured to operate by receiving a first power voltage. The second semiconductor apparatus may be configured to operate by receiving a second power voltage, and may be coupled to the first semiconductor apparatus to perform data communication. The power management integrated circuit may be configured to generate the first power voltage and the second power voltage. The first semiconductor apparatus may include a voltage clamping circuit configured to change a level of the first power voltage by detecting the level of the first power voltage. The voltage clamping circuit may generate a voltage detection signal by detecting the first power voltage or generates the voltage detection signal by comparing the first power voltage with a reference voltage based on an operation period of the first semiconductor apparatus. The voltage clamping circuit may change the level of the first power voltage based on the voltage detection signal.

DETAILED DESCRIPTION

Hereinafter, a semiconductor apparatus in accordance with the present teachings is described below with reference to the accompanying drawings through various embodiments.

Figure 1:
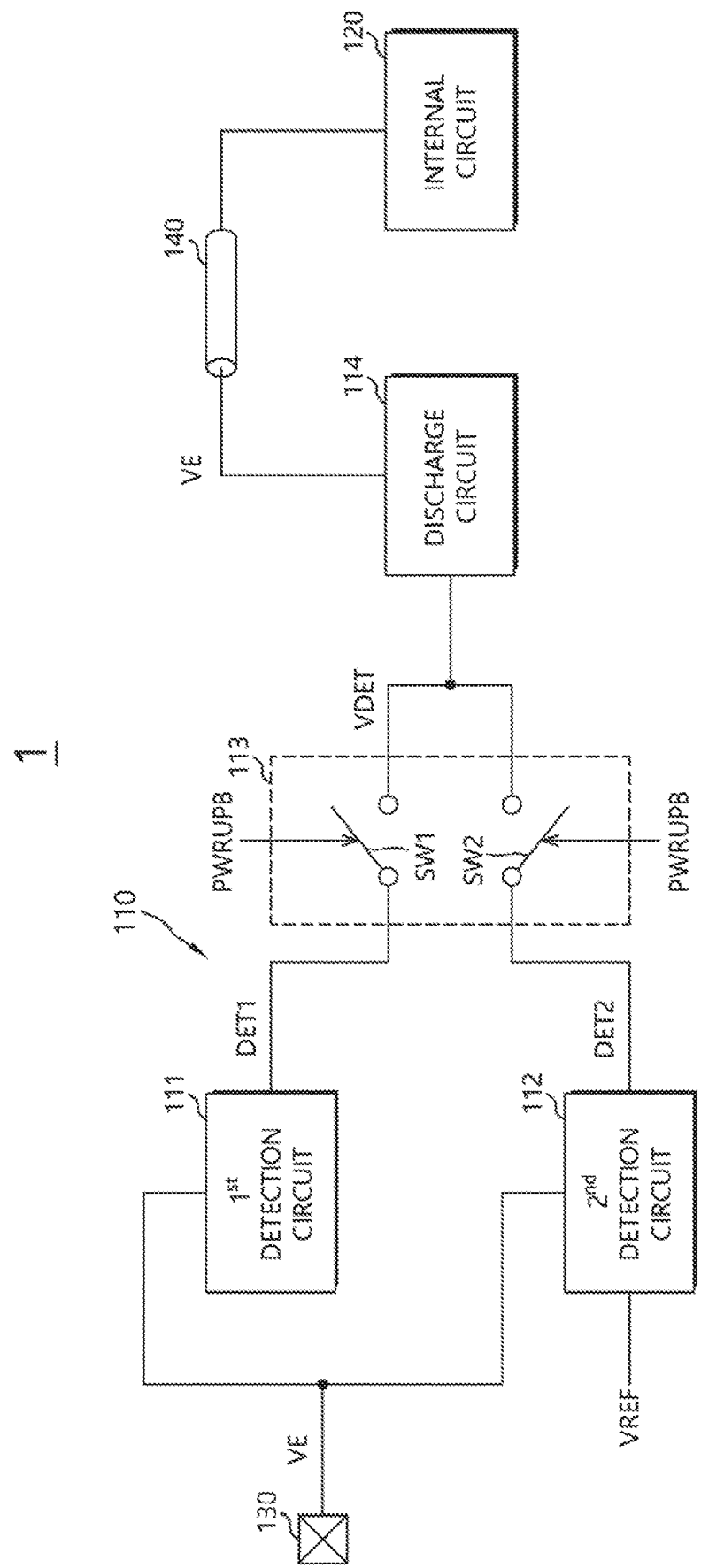
FIG. 1 illustrates a configuration of a semiconductor apparatus, in accordance with an embodiment.

FIG. 1 illustrates a configuration of a semiconductor apparatus 1, in accordance with an embodiment. Referring to FIG. 1, the semiconductor apparatus 1 may operate by receiving a power voltage VE. The semiconductor apparatus 1 may include a voltage clamping circuit 110 and an internal circuit 120. The voltage clamping circuit 110 may receive the power voltage VE and may detect the voltage level of the power voltage VE. The voltage clamping circuit 110 may detect an abnormal level variance of the power voltage VE, such as a voltage surge, a spike, noise, overshooting, and so forth. The abnormal level variance of the power voltage VE may be a kind of electrical over-stress. The voltage clamping circuit 110 may stabilize the voltage level of the power voltage VE according to the result of the detection. The voltage clamping circuit 110 may compensate for the various abnormal voltage level variances of the power voltage VE and stabilize the power voltage VE by adjusting the voltage level of the power voltage VE according to the detection result of the voltage level of the power voltage VE.

The voltage clamping circuit 110 may generate a voltage detection signal VDET according to operation periods of the semiconductor apparatus 1. The voltage clamping circuit 110 may generate the voltage detection signal VDET by detecting the voltage level of the power voltage VE. The voltage clamping circuit 110 may generate the voltage detection signal VDET by comparing the levels of the power voltage VE and a reference voltage VREF. The operation periods may include a first operation period and a second operation period. The first operation period and the second operation period may be differentiated according to an operation of power-up. For example, the first operation period may be a period during which the semiconductor apparatus 1 powers up, and the second operation period may be a period after the semiconductor apparatus 1 has powered up. The voltage clamping circuit 110 may generate the voltage detection signal VDET by detecting the voltage level of the power voltage VE during the first operation period, and may generate the voltage detection signal VDET by comparing the levels of the power voltage VE and the reference voltage VREF during the second operation period. The voltage clamping circuit 110 may change the voltage level of the power voltage VE based on the voltage detection signal VDET. For example, the voltage clamping circuit 110 may decrease the voltage level of the power voltage VE and/or discharge the power voltage VE based on the voltage detection signal VDET.

The internal circuit 120 may include a logic circuit configured to perform various operations. The internal circuit 120 may operate by receiving the power voltage VE. The semiconductor apparatus 1 may receive the power voltage VE through a power pad 130. The power voltage VE may be internally distributed within the semiconductor apparatus 1 through a power mesh 140. The internal circuit 120 may receive the power voltage VE through the power mesh 140. The internal circuit 120 may receive the power voltage VE, the voltage level of which is compensated by the voltage clamping circuit 110. The internal circuit 120 may stably operate regardless of the abnormal level variance of the power voltage VE because the internal circuit 120 receives the power voltage VE having a level stabilized by the voltage clamping circuit 110.

Referring to FIG. 1, the voltage clamping circuit 110 may include a first detection circuit 111, a second detection circuit 112, a selection circuit 113, and a discharge circuit 114. The first detection circuit 111 may receive the power voltage VE through the power pad 130. The first detection circuit 111 may generate a first detection signal DET1 by detecting the voltage level of the power voltage VE. The first detection circuit 111 may generate the first detection signal DET1 by detecting the power voltage VE itself. The first detection circuit 111 may detect whether the voltage level of the power voltage VE comes close to a target level. The target level may be a reference level used to determine the abnormal level variance of the power voltage VE. Because the first detection circuit 111 generates the first detection signal DET1 by detecting the power voltage VE itself without using the reference voltage VREF, the first detection circuit 111 may effectively detect the abnormal level variance of the power voltage VE while the voltage level of the power voltage VE is unstable during the first operation period of the semiconductor apparatus 1.

The second detection circuit 112 receives the power voltage VE through the power pad 130. The second detection circuit 112 may generate a second detection signal DET2 by detecting the voltage level of the power voltage VE. The second detection circuit 112 may generate the second detection signal DET2 by comparing the power voltage VE with the reference voltage VREF. For example, the second detection circuit 112 may generate the second detection signal DET2 by comparing the levels between a distributed voltage with the reference voltage VREF. The distributed voltage may be a voltage corresponding to the power voltage VE and may be generated by distributing the power voltage VE. For example, the distributed voltage may have half the voltage level of the power voltage VE. The reference voltage VREF may have a level corresponding to the target level. For example, the reference voltage VREF is half of the target level. The reference voltage VREF may have the intended level after the voltage level of the power voltage VE is stabilized. The voltage level of the reference voltage VREF may be stabilized in the second operation period, which is after the semiconductor apparatus 1 is powered up. Therefore, it may be preferred that the second detection circuit 112 detects the voltage level of the power voltage VE during the second operation period of the semiconductor apparatus 1 rather than during the first operation period of the semiconductor apparatus 1. The second detection circuit 112 may perform a more precise detection operation than the first detection circuit 111 because the second detection circuit 112 detects the voltage level of the power voltage VE by using the reference voltage VREF.

The selection circuit 113 may output the voltage detection signal VDET by receiving the first detection signal DET1 and the second detection signal DET2. The selection circuit 113 may output one of the first detection signal DET1 and the second detection signal DET2 as the voltage detection signal VDET according to the operation periods of the semiconductor apparatus 1. The selection circuit 113 may output the first detection signal DET1 as the voltage detection signal VDET during the first operation period of the semiconductor apparatus 1, and may output the second detection signal DET2 as the voltage detection signal VDET during the second operation period of the semiconductor apparatus 1. The selection circuit 113 may receive a power-up signal PWRUP to discriminate the operation periods of the semiconductor apparatus 1. The selection circuit 113 may output one of the first detection signal DET1 and the second detection signal DET2 as the voltage detection signal VDET based on the power-up signal PWRUP. The selection circuit 113 may output the first detection signal DET1 as the voltage detection signal VDET based on the power-up signal PWRUP, which is disabled while the semiconductor apparatus 1 is being powered up. The selection circuit 113 may output the second detection signal DET2 as the voltage detection signal VDET based on the power-up signal PWRUP, which is enabled after the semiconductor apparatus 1 is powered up.

The selection circuit 113 may include a first switch SW1 and a second switch SW2. The first switch SW1 may receive a complementary signal PWRUPB of the power-up signal PWRUP, may be turned on when the power-up signal PWRUP is disabled, and may output the first detection signal DET1 as the voltage detection signal VDET. The second switch SW2 may receive the power-up signal PWRUP, may be turned on when the power-up signal PWRUP is enabled, and may output the second detection signal DET2 as the voltage detection signal VDET.

As described above, the voltage detection signal VDET may be generated based on the detection result of the power voltage VE by the first detection circuit 111 during the first operation period, and may be generated based on the detection result of the power voltage VE by the second detection circuit 112 during the second operation period. In accordance with an embodiment of the present disclosure, the first detection circuit 111 and the second detection circuit 112 may have different detection characteristics from each other, may be selected as a detection circuit based on having appropriate detection characteristics according to the operation periods of the semiconductor apparatus 1, and may detect the voltage level of the power voltage VE. Therefore, the voltage clamping circuit 110 may precisely detect the abnormal level variance of the power voltage VE during each operation period of the semiconductor apparatus 1.

In an embodiment, the first detection circuit 111 and the second detection circuit 112 may be modified to directly receive the power-up signal PWRUP. When the first detection circuit 111 and the second detection circuit 112 directly receive the power-up signal PWRUP, the selection circuit 113 might not be used in the voltage clamping circuit 110. The first detection circuit 111 may be modified to detect the voltage level of the power voltage VE and generate the first detection signal DET1 when the power-up signal PWRUP is disabled. The second detection circuit 112 may be modified to detect the voltage level of the power voltage VE and generate the second detection signal DET2 when the power-up signal PWRUP is enabled.

The discharge circuit 114 may receive the voltage detection signal VDET. The discharge circuit 114 may be coupled to a node of the power voltage VE through the power mesh 140. The discharge circuit 114 may change the voltage level of the power voltage VE based on the voltage detection signal VDET. For example, the discharge circuit 114 may decrease the voltage level of the power voltage VE or discharge the power voltage VE when the voltage detection signal VDET is enabled. The discharge circuit 114 may decrease the voltage levels of the node of the power voltage VE and the power mesh 140 by coupling the node of the power voltage VE to a node of a ground voltage VSS when the voltage detection signal VDET is enabled. In alternate embodiments, the discharge circuit 114 may decrease the voltage levels of the node of the power voltage VE and the power mesh 140 by coupling the node of the power voltage VE to a node of an intermediate voltage having a voltage level between the ground voltage VSS and the power voltage VE when the voltage detection signal VDET is enabled. The node of the power voltage VE may be coupled to the node of the intermediate voltage either directly or through a resistive network.

Figure 2:
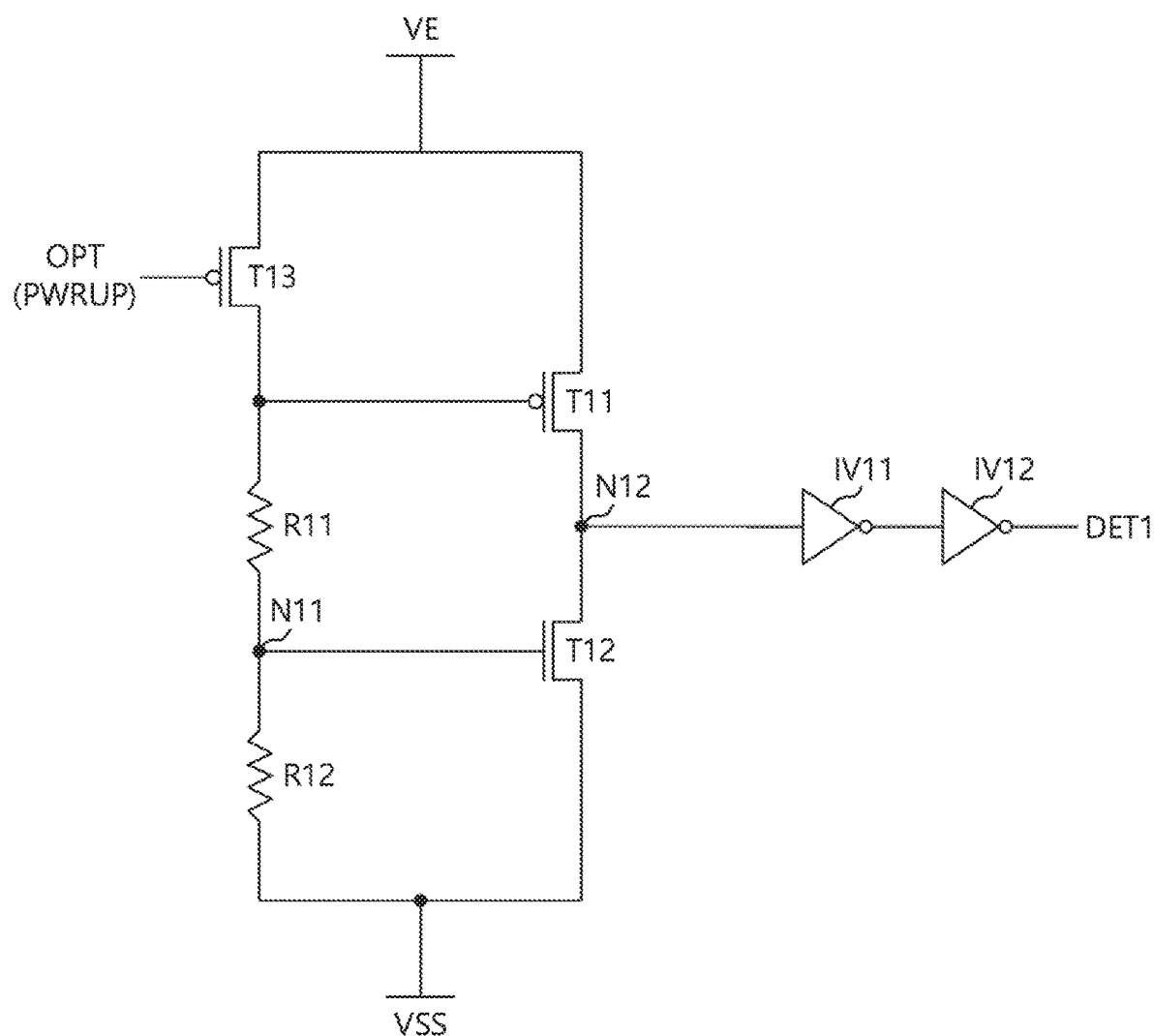
FIG. 2 illustrates a configuration of a first detection circuit shown in FIG. 1.

FIG. 2 illustrates a configuration of the first detection circuit 111 shown in FIG. 1. The first detection circuit 111 may include a first resistance R11, a second resistance R12, a first transistor T11, a second transistor T12, a first inverter IV11, and a second inverter IV12. The first resistance R11 may be coupled between the node of the power voltage VE and a first node N11. The second resistance R12 may be coupled between the first node N11 and the node of the ground voltage VSS. The first transistor T11 may be a P-channel MOS transistor. The first transistor T11 may be coupled to the node of the power voltage VE at its gate and source, and may be coupled to a second node N12 at its drain. The second transistor T12 may be a N-channel MOS transistor. The second transistor T12 may be coupled to the first node N11 at its gate, may be coupled to the second node N12 at its drain, and may be coupled to the node of the ground voltage VSS at its source. The first inverter IV11 may invert a signal output from the second node N12. The second inverter IV12 may generate the first detection signal DET1 by inverting a signal output from the first inverter IV11.

The first detection circuit 111 may provide the power voltage VE as the first detection signal DET1 when the voltage level of the power voltage VE is low enough to turn on the first transistor T11. When the voltage level of the power voltage VE increases enough, the first transistor T11 may be turned off. The first detection circuit 111 may generate the first detection signal DET1 by detecting the voltage voltage level of the first node N11. The voltage voltage level of the first node N11 may be determined according to a ratio between the first resistance R11 and the second resistance R12. For example, the ratio between the first resistance R11 and the second resistance R12 may be set such that the first node N11 has the voltage level sufficient to turn on the second transistor T12 when the voltage level of the power voltage VE comes close to the target level. When the voltage level of the power voltage VE comes close to the target level, the second transistor T12 may be turned on and the second node N12 may be driven by the ground voltage VSS to generate the first detection signal DET1 enabled to a low level.

The first detection circuit 111 may further include a third transistor T13. For example, the third transistor T13 may be a P-channel MOS transistor. The third transistor T13 may receive an option signal OPT at its gate, may be coupled to the node of the power voltage VE at its source, and may be coupled commonly to the first resistance R11 and the gate of the first transistor T11 at its drain. The third transistor T13 may function as an option switch. The third transistor T13 may deactivate the first detection circuit 111 such that the first detection circuit 111 does not operate. The third transistor T13 may deactivate the first detection circuit 111 when the option signal OPT is enabled. When the option signal OPT is enabled, the third transistor T13 may be turned on and may provide the power voltage VE to the first resistance R11 and the gate of the first transistor T11. The option signal OPT may be implemented with various signals. For example, a test mode signal may be used as the option signal OPT. In an embodiment, the power-up signal PWRUP may be used as the option signal OPT and the third transistor T13 may control the first detection circuit 111 to be activated only in the first operation period based on the power-up signal PWRUP.

Figure 3:
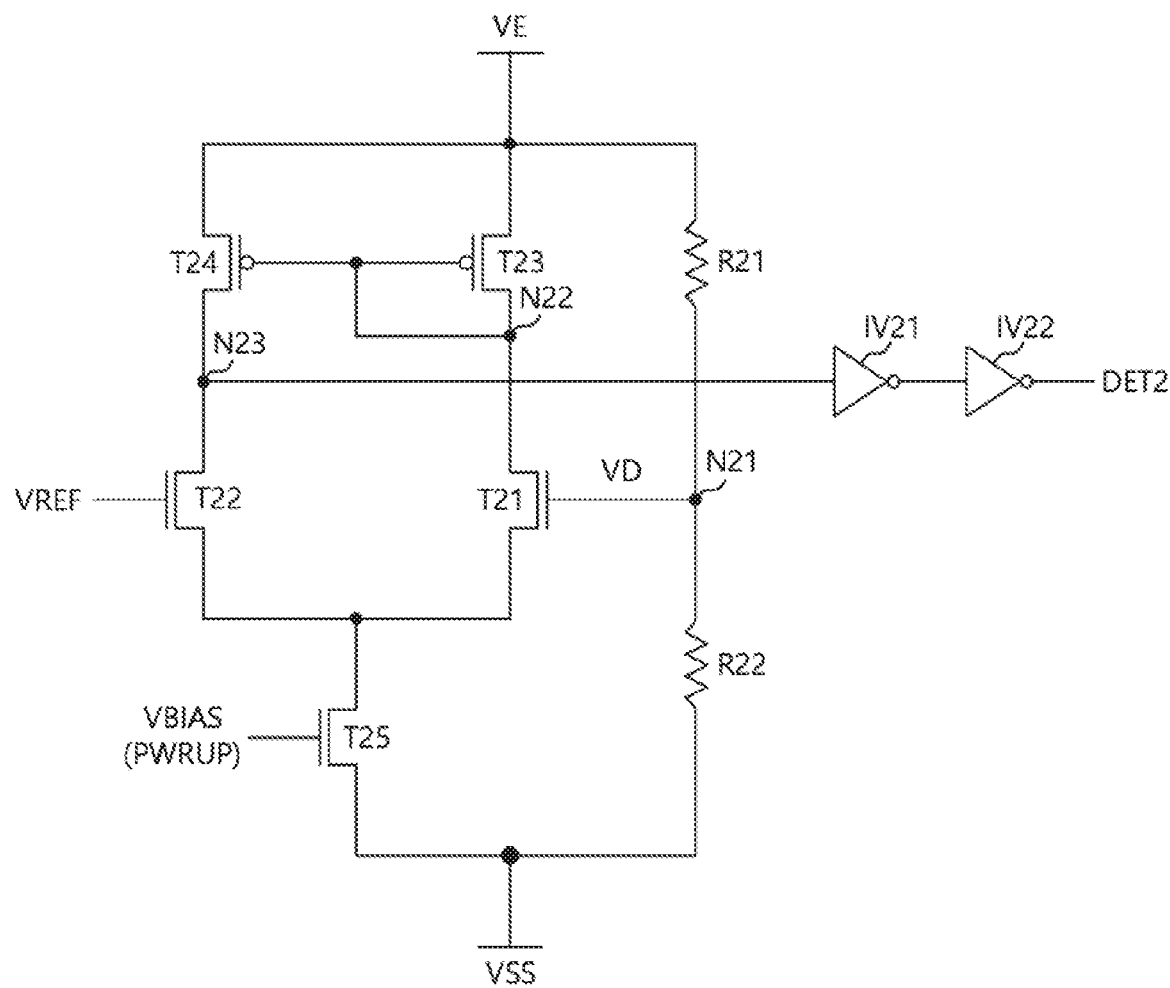
FIG. 3 illustrates a configuration of a second detection circuit shown in FIG. 1.

FIG. 3 illustrates a configuration of the second detection circuit 112 shown in FIG. 1. Referring to FIG. 3, the second detection circuit 112 may have the configuration of a differential amplification circuit. The second detection circuit 112 may include a first resistance R21, a second resistance R22, a first transistor T21, a second transistor T22, a third transistor T23, a fourth transistor T24, a first inverter IV21, and a second inverter IV22. The first resistance R21 may be coupled between the node of the power voltage VE and a first node N21. The second resistance R22 may be coupled between the first node N21 and the node of the ground voltage VSS. The first resistance R21 and the second resistance R22 may determine the voltage voltage level of the first node N21 by dividing the voltage level of the power voltage VE. The voltage voltage level of the first node N21 may correspond to the voltage level of the divided voltage VD. For example, the first resistance R21 and the second resistance R22 may have a ratio of '1:1', and the divided voltage VD may have the level corresponding to a half of the power voltage VE.

In an embodiment, the first transistor T21 and the second transistor T22 may be N-channel MOS transistors. The first transistor T21 may be coupled to the first node N21 and may receive the divided voltage VD at its gate, may be coupled to a second node N22 at its drain and may be coupled to the node of the ground voltage VSS at its source. The second transistor T22 may receive the reference voltage VREF at its gate, may be coupled to a third node N23 at its drain, and may be coupled to the node of the ground voltage VSS at its source. The third transistor T23 and the fourth transistor T24 may be P-channel MOS transistors. The third transistor T23 may be coupled to the second node N22 at its gate and drain and may be coupled to the node of the power voltage VE at its source. The fourth transistor T24 may be coupled to the second node N22 at its gate, may be coupled to the node of the power voltage VE at its source, and may be coupled to the third node N23 at its drain. The third transistor T23 and the fourth transistor T24 may serve as a current mirror, and may provide the same amount of current to the second node N22 and the third node N23 based on the voltage voltage level of the second node N22.

The first inverter IV21 may invert a signal output from the third node N23 and may output the inverted signal. The second inverter IV22 may generate the second detection signal DET2 by inverting the output of the first inverter IV21.

The second detection circuit 112 may further include a fifth transistor T25. The fifth transistor T25 may be coupled among the first transistor T21, the second transistor T22, and the node of the ground voltage VSS. For example, the fifth transistor T25 may be a N-channel MOS transistor. The fifth transistor T25 may receive a bias voltage VBIAS at its gate, may be coupled to the sources of the first transistor T21 and the second transistor T22 at its drain, and may be coupled to the node of the ground voltage VSS at its source. The fifth transistor T25 may activate the second detection circuit 112 by forming a current path from the first transistor T21 and the second transistor T22 to the node of the ground voltage VSS. The bias voltage VBIAS may be arbitrary, and may have a normal level after the power voltage VE becomes stable. In an embodiment, the fifth transistor T25 may receive the power-up signal PWRUP at its gate. In some embodiments, the fifth transistor may receive a gated signal of the bias voltage VBIAS and the power-up signal PWRUP at its gate. The fifth transistor T25 may control the second detection circuit 112 to be activated only during the second operation period, based on the power-up signal PWRUP.

When the voltage level of the power voltage VE is stable, the voltage level of the divided voltage VD may be lower than the voltage level of the reference voltage VREF. Therefore, a greater amount of current may flow through the second transistor T22 than through the first transistor T21, and the voltage voltage level of the third node N23 may be higher than the voltage voltage level of the second node N22. Because a signal of a high level is output from the third node N23, the second detection signal DET2 may become disabled to a high level. When the voltage level of the power voltage VE abnormally rises to become higher than the target level, the voltage level of the divided voltage VD may be higher than the voltage level of the reference voltage VREF. Therefore, a greater amount of current may flow through the first transistor T21 than through the second transistor T22, and the voltage voltage level of the third node N23 may be lower than the voltage voltage level of the second node N22. Because a signal of a low level is output from the third node N23, the second detection signal DET2 may become enabled to a low level.

Figure 4:
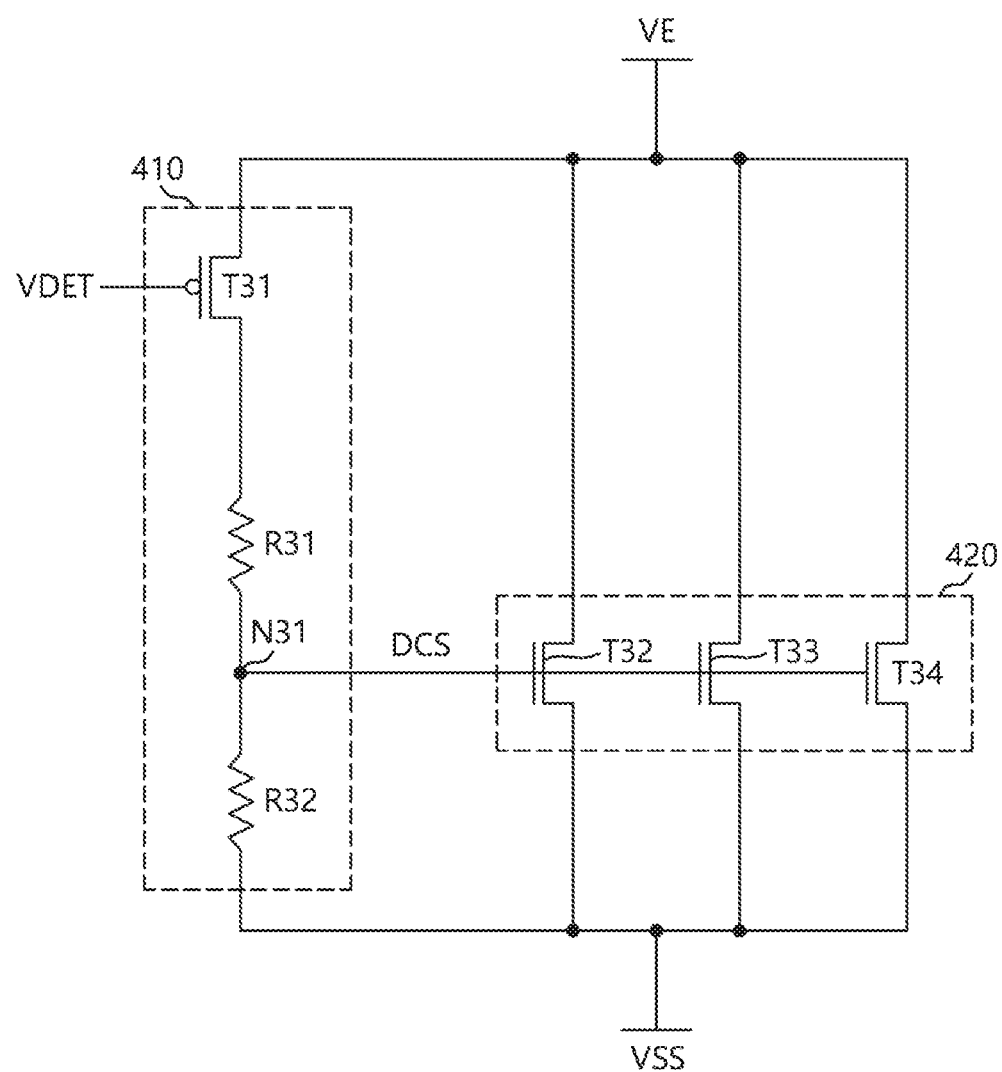
FIG. 4 illustrates a configuration of a discharge circuit shown in FIG. 1.

FIG. 4 illustrates a configuration of the discharge circuit 114 shown in FIG. 1. Referring to FIG. 4, the discharge circuit 114 may include a control signal generation unit 410 and a discharge unit 420. The control signal generation unit 410 may receive the voltage detection signal VDET. The control signal generation unit 410 may generate a discharge control signal DCS based on the voltage detection signal VDET. When the voltage detection signal VDET is enabled, the control signal generation unit 410 may divide the voltage level of the power voltage VE and may provide the divided voltage as the discharge control signal DCS. The discharge unit 420 may receive the discharge control signal DCS. The discharge unit 420 may couple the nodes of the power voltage VE and the ground voltage VSS when the discharge control signal DCS is enabled. The discharge unit 420 may lower the voltage level of the power voltage VE and/or discharge the power voltage VE by coupling the nodes of the power voltage VE and the ground voltage VSS.

Referring to FIG. 4, the control signal generation unit 410 may include a first transistor T31, a first resistance R31, and a second resistance R32. For an embodiment, the first transistor T31 may be a P-channel MOS transistor. The first transistor T31 may receive the voltage detection signal VDET at its gate and may be coupled to the node of the power voltage VE at its source. The first resistance R31 may be coupled to a drain of the first transistor T31 at one end and may be coupled to a first node N31 at the other end. The second resistance R32 may be coupled to the first node N31 at one end and may be coupled to the node of the ground voltage VSS at the other end. The discharge control signal DCS may be generated from the first node N31.

The discharge unit 420 may include a second transistor T32, a third transistor T33, and a fourth transistor T34. Although the discharge unit 420 is shown to have three transistors, a number of transistors that configure the discharge unit 420 may be greater or less than three. Each of the second transistor T32, the third transistor T33, and the fourth transistor T34 may be an N-channel MOS transistor. The second transistor T32 may receive the discharge control signal DCS at its gate, may be coupled to the node of the power voltage VE at its drain, and may be coupled to the node of the ground voltage VSS at its source. The third transistor T33 may receive the discharge control signal DCS at its gate, may be coupled to the node of the power voltage VE at its drain, and may be coupled to the node of the ground voltage VSS at its source. The fourth transistor T34 may receive the discharge control signal DCS at its gate, may be coupled to the node of the power voltage VE at its drain, and may be coupled to the node of the ground voltage VSS at its source. The second transistor T32, third transistor T33, and fourth transistor T34 may have the same size and/or drivability as one another or may have different sizes and/or drivabilities from one another. When the discharge control signal DCS is enabled, the second transistor T32, third transistor T33, and fourth transistor T34 may lower the voltage level of the power voltage VE by coupling the nodes of the power voltage VE and the ground voltage VSS. The ratio of the first resistance R31 and second resistance R32 of the control signal generation unit 410 may be set such that the discharge control signal DCS has a high voltage level sufficient to turn on the second transistor T32, third transistor T33, and fourth transistor T34 when the voltage level of the power voltage VE becomes higher than the target level.

Figure 5:
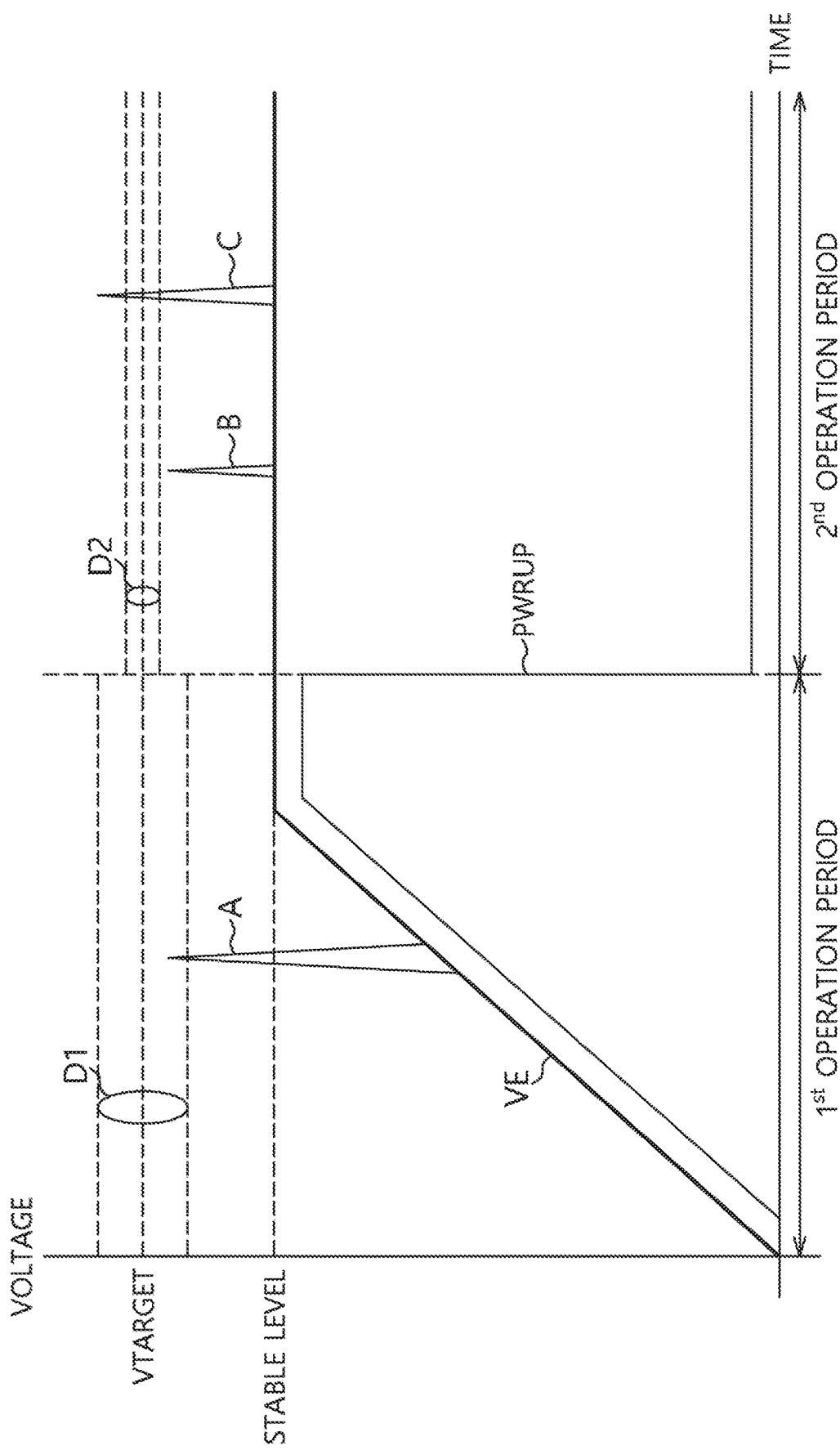
FIG. 5 illustrates an operation of a semiconductor apparatus, in accordance with an embodiment.

FIG. 5 illustrates an operation of the semiconductor apparatus 1 in accordance with an embodiment of the present disclosure. An operation of the semiconductor apparatus 1 is described with reference to FIGS. 1 to 5. When the semiconductor apparatus 1 is in a low-power mode and enters a power-up mode, the power voltage VE may be provided to the semiconductor apparatus 1. The voltage level of the power voltage VE may rise as the semiconductor apparatus 1 powers up. The voltage level of the power voltage VE may rise to a stable level during the first operation period. The second operation period may be a period after the first operation period or after the voltage level of the power voltage VE achieves a stable level. The power-up signal PWRUP may rise along with the voltage level of the power voltage VE during the first operation period and may become enabled to a low level when the voltage level of the power voltage VE reaches the stable level. During the first operation period, the voltage clamping circuit 110 may detect the voltage level of the power voltage VE through the first detection circuit 111. In an embodiment, the first detection circuit 111 may detect the power voltage VE itself while the second detection circuit 112 may detect the voltage level of the power voltage VE by comparing the power voltage VE with the reference voltage VREF. Therefore, the second detection circuit 112 may perform a more precise detection operation than the first detection circuit 111 and may have a smaller target level distribution.

Referring to FIG. 5, the target level Vtarget may be a reference for determining an abnormal level change of the power voltage VE. When the voltage level of the power voltage VE is lower than the target level Vtarget, the durability or the reliability of the internal circuit 120 may be maintained without level control of the power voltage VE. When the voltage level of the power voltage VE is higher than the target level Vtarget, the internal circuit 120 may cause an unintended problem therein and thus the voltage clamping circuit 110 may be used to lower the voltage level of the power voltage VE. The first detection circuit 111 may have first target level distribution D1, and the second detection circuit 112 may have second target level distribution D2. The second target level distribution D2 may be smaller than the first target level distribution D1. The first detection circuit 111 may enable the first detection signal DET1 when the voltage level of the power voltage VE reaches the first target level distribution D1. The second detection circuit 112 may enable the second detection signal DET2 when the voltage level of the power voltage VE reaches the second detection signal DET2.

When the voltage level of the power voltage VE abnormally changes (A) during the first operation period, the first detection circuit 111 may enable the first detection signal DET1. However, the voltage level of the power voltage VE does not yet reach the second target level distribution D2 and thus the second detection circuit 112 may keep the second detection signal DET2 disabled. The selection circuit 113 may provide the first detection signal DET1 as the voltage detection signal VDET based on the disabled power-up signal PWRUP, and the voltage detection signal VDET may be enabled. The discharge circuit 114 may couple the nodes of the power voltage VE and the ground voltage VSS based on the voltage detection signal VDET, and the voltage level of the power voltage VE may drop. Therefore, the abnormally increased voltage level of the power voltage VE may become stable. The semiconductor apparatus 1 may prevent abnormal level rise of the power voltage VE without using another voltage such as the reference voltage VREF by detecting the voltage level of the power voltage VE through the first detection circuit 111 during the first operation period.

During the second operation period, the voltage level of the power voltage VE may become stable and the reference voltage VREF may be normally generated. When the voltage level of the power voltage VE abnormally changes (B) for a first time during the second operation period, the voltage level of the power voltage VE may reach the first target level distribution D1 but might not yet reach the second target level distribution D2. The first detection circuit 111 may enable the first detection signal DET1 but the second detection circuit 112 may disable the second detection signal DET2. The selection circuit 113 may provide the second detection signal DET2 as the voltage detection signal VDET based on the enabled power-up signal PWRUP, and the voltage detection signal VDET may keep disabled. Therefore, the discharge circuit 114 might not change the voltage level of the power voltage VE.

When the voltage level of the power voltage VE abnormally changes (C) for a second time during the second operation period, the first detection circuit 111 and second detection circuit 112 may enable the first detection signal DET1 and second detection signal DET2, respectively. The selection circuit 113 may provide the second detection signal DET2 as the voltage detection signal VDET based on the enabled power-up signal PWRUP, and the voltage detection signal VDET may be enabled. The discharge circuit 114 may coupled the nodes of the power voltage VE and the ground voltage VSS based on the voltage detection signal VDET, and the voltage level of the power voltage VE may drop. Therefore, the abnormally increased voltage level of the power voltage VE may become stable. The semiconductor apparatus 1 may control the discharge circuit 114 to adjust the voltage level of the power voltage VE when precisely detecting the voltage level of the power voltage VE to reach the target level Vtarget through the second detection circuit 112 during the second operation period. Therefore, unnecessary power consumption may be reduced and the precise clamping operation of the voltage clamping circuit 110 may be secured.

Figure 6:
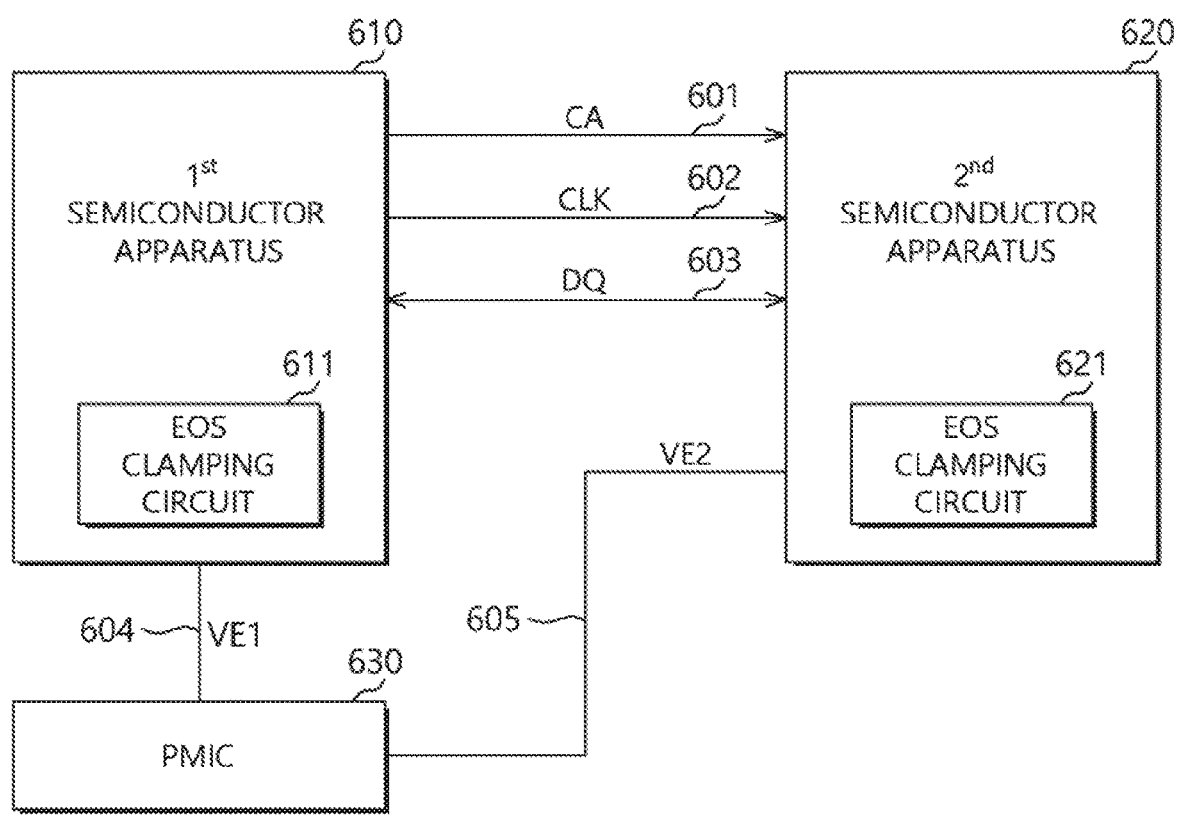
FIG. 6 illustrates a configuration of a semiconductor system, in accordance with an embodiment.

FIG. 6 illustrates a configuration of a semiconductor system 6 in accordance with an embodiment of the present disclosure. Referring to FIG. 6, the semiconductor system 6 may include a first semiconductor apparatus 610, a second semiconductor apparatus 620, and a power management integrated circuit (PMIC) 630. The first semiconductor apparatus 610 may provide various control signals required for the second semiconductor apparatus 620 to operate. The first semiconductor apparatus 610 may include various host devices. For example, the first semiconductor apparatus 610 may include one or more host devices, such as a central processing unit (CPU), a graphic processing unit (GPU), a multi-media processor (MMP), a digital signal processor, an application processor (AP), and a memory controller. For example, the second semiconductor apparatus 620 may be a memory apparatus. The memory apparatus may include a volatile memory apparatus and a non-volatile memory apparatus. The volatile memory apparatus may include a static random access memory (static RAM: SRAM), a dynamic RAM (DRAM), and/or a synchronous DRAM (SDRAM). The non-volatile memory apparatus may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth.

The second semiconductor apparatus 620 may be coupled to the first semiconductor apparatus 610 through a plurality of buses. The plurality of buses may be a signal transmission path, a link, or a channel for transferring a signal. The plurality of buses may include a command address bus 601, a clock bus 602, and a data bus 603. Each of the command address bus 601 and the clock bus 602 may be a one-way bus, and the data bus 603 may be a two-way bus. The second semiconductor apparatus 620 may be coupled to the first semiconductor apparatus 610 through the command address bus 601, and may receive a command address signal CA through the command address bus 601. The second semiconductor apparatus 620 may be coupled to the first semiconductor apparatus 610 through the clock bus 602, and may receive a clock signal CLK through the clock bus 602. The clock signal CLK may include one or more pairs of clock signals. The second semiconductor apparatus 620 may be coupled to the first semiconductor apparatus 610 through the data bus 603, and may receive a data DQ from the first semiconductor apparatus 610, or may provide a data DQ to the first semiconductor apparatus 610 through the data bus 603.

The power management integrated circuit 630 may receive power from an external power source (not illustrated) and may generate a first power voltage VE1 and a second power voltage VE2. The first power voltage VE1 may be a power voltage having a level sufficient to be used in the first semiconductor apparatus 610, and the second power voltage VE2 may be a power voltage having a level sufficient to be used in the second semiconductor apparatus 620. The power management integrated circuit 630 may include a voltage generation circuit, a voltage regulator, and so forth to generate the first power voltage VE1 and second power voltage VE2 from the external power source. The power management integrated circuit 630 may be coupled to the first semiconductor apparatus 610 through a first power bus 604. The power management integrated circuit 630 may provide the first power voltage VE1 to the first semiconductor apparatus 610 through the first power bus 604. The power management integrated circuit 630 may be coupled to the second semiconductor apparatus 620 through a second power bus 605. The power management integrated circuit 630 may provide the second power voltage VE2 to the second semiconductor apparatus 620 through the second power bus 605.

The first semiconductor apparatus 610 may receive the first power voltage VE1 from the power management integrated circuit 630 through a power pad (not illustrated). The first semiconductor apparatus 610 may include an electrical over stress (EOS) clamping circuit 611. The EOS clamping circuit 611 may detect the voltage level of the first power voltage VE1 and may adjust, when the voltage level of the first power voltage VE1 abnormally changes, the voltage level of the first power voltage VE1. The first power voltage VE1, which becomes stable by the EOS clamping circuit 611, may be provided to the internal circuits within the first semiconductor apparatus 610. The EOS clamping circuit 611 may be implemented with the voltage clamping circuit 110, described with reference to FIG. 1.

The second semiconductor apparatus 620 may receive the second power voltage VE2 from the power management integrated circuit 630 through a power pad (not illustrated). The second semiconductor apparatus 620 may include an EOS clamping circuit 621. The EOS clamping circuit 621 may detect the voltage level of the second power voltage VE2 and may adjust, when the voltage level of the second power voltage VE2 abnormally changes, the voltage level of the second power voltage VE2. The second power voltage VE2, which becomes stable by the EOS clamping circuit 621, may be provided to the internal circuits within the second semiconductor apparatus 620. The EOS clamping circuit 621 may be implemented with the voltage clamping circuit 110, described with reference to FIG. 1.

While certain embodiments have been described above, it will be understood to those skilled in the art that the described embodiments serve as examples of a larger number of possible embodiments. Accordingly, the voltage clamping circuit, semiconductor apparatus, and semiconductor system including the voltage clamping circuit should not be limited based on the described embodiments. Rather, the voltage clamping circuit, semiconductor apparatus, and semiconductor system including the voltage clamping circuit described herein should only be limited in light of the claims that follow when taken in conjunction with the above description and accompanying drawings.

What is claimed is:

1. A voltage clamping circuit comprising:
   a first detection circuit configured to generate a first detection signal by detecting a voltage level of a power voltage;
   a second detection circuit configured to generate a second detection signal by detecting the voltage level of the power voltage;
   a selection circuit configured to output one of the first detection signal and the second detection signal as a voltage detection signal based on whether the voltage level of the power voltage is stable; and
   a discharge circuit configured to change the voltage level of the power voltage based on the voltage detection signal.

2. The voltage clamping circuit of claim 1, wherein the first detection circuit generates the first detection signal by detecting whether the voltage level of the power voltage reaches a target level.

3. The voltage clamping circuit of claim 1, wherein the second detection circuit generates the second detection signal by comparing a divided voltage corresponding to the voltage level of the power voltage with a reference voltage corresponding to the target level.

4. The voltage clamping circuit of claim 1, wherein the first detection circuit detects a first target level distribution, wherein the second detection circuit detects a second target level distribution, and wherein the second target level distribution is smaller than the first target level distribution.

5. The voltage clamping circuit of claim 1,
   wherein the selection circuit is configured to receive a power-up signal, and the power-up signal is enabled when the voltage level of the power voltage becomes stable after the power voltage is applied, and
   wherein the selection circuit outputs the first detection signal as the voltage detection signal while the power-up signal is disabled and outputs the second detection signal as the voltage detection signal while the power-up signal is enabled.

6. The voltage clamping circuit of claim 1, wherein the discharge circuit comprises:
   a control signal generation unit configured to generate a discharge control signal based on the voltage detection signal; and a discharge unit configured to couple a node of the power voltage to a node of a ground voltage based on the discharge control signal.

7. A semiconductor apparatus comprising:
a voltage clamping circuit configured to generate a voltage detection signal by detecting a voltage level of a power voltage during a first operation period of the semiconductor apparatus, configured to generate the voltage detection signal by comparing the power voltage with a reference voltage during a second operation period of the semiconductor apparatus, and configured to change the voltage level of the power voltage based on the voltage detection signal; and
an internal circuit configured to operate by receiving the power voltage.

8. The semiconductor apparatus of claim 7, wherein the first operation period is a period during which the semiconductor apparatus powers up, and wherein the second operation period is a period after the semiconductor apparatus has powered up.

9. The semiconductor apparatus of claim 7, wherein the voltage clamping circuit comprises:
a first detection circuit configured to generate a first detection signal by detecting the voltage level of the power voltage;
a second detection circuit configured to generate a second detection signal by comparing the power voltage with the reference voltage;
a selection circuit configured to output the first detection signal as the voltage detection signal during the first operation period and configured to output the second detection signal as the voltage detection signal during the second operation period; and
a discharge circuit configured to change the voltage level of the power voltage based on the voltage detection signal.

10. The semiconductor apparatus of claim 9, wherein the first detection circuit generates the first detection signal by detecting whether the voltage level of the power voltage reaches a target level.

11. The semiconductor apparatus of claim 9, wherein the second detection circuit generates the second detection signal by comparing a divided voltage corresponding to the voltage level of the power voltage with the reference voltage corresponding to the target level.

12. The semiconductor apparatus of claim 9, wherein the first detection circuit detects a first target level distribution, wherein the second detection circuit detects a second target level distribution, and wherein the second target level distribution is smaller than the first target level distribution.

13. The semiconductor apparatus of claim 9, wherein the discharge circuit comprises:
a control signal generation unit configured to generate a discharge control signal based on the voltage detection signal; and
a discharge unit configured to couple a node of the power voltage to a node of a ground voltage based on the discharge control signal.

14. A semiconductor system comprising:
a first semiconductor apparatus configured to operate by receiving a first power voltage;
a second semiconductor apparatus configured to operate by receiving a second power voltage, wherein the second semiconductor apparatus is coupled to the first semiconductor apparatus to perform data communication; and
a power management integrated circuit configured to generate the first power voltage and the second power voltage,
wherein the first semiconductor apparatus comprises a voltage clamping circuit configured to change a voltage level of the first power voltage by detecting the voltage level of the first power voltage, and
wherein the voltage clamping circuit generates a voltage detection signal by detecting the first power voltage or generates the voltage detection signal by comparing the first power voltage with a reference voltage based on an operation period of the first semiconductor apparatus, and the voltage clamping circuit changes the voltage level of the first power voltage based on the voltage detection signal.

15. The semiconductor system of claim 14, wherein the voltage clamping circuit comprises:
a first detection circuit configured to generate the voltage detection signal by detecting the voltage level of the first power voltage during a first operation period of the first semiconductor apparatus;
a second detection circuit configured to generate the voltage detection signal by comparing the first power voltage with the reference voltage during a second operation period of the second semiconductor apparatus; and
a discharge circuit configured to change the voltage level of the first power voltage based on the voltage detection signal.

16. The semiconductor system of claim 15, wherein the first operation period is a period during which the first semiconductor apparatus powers up, and the second operation period is a period after which the first semiconductor apparatus has powered up.

17. The semiconductor system of claim 15, wherein the first detection circuit detects a first target level distribution, wherein the second detection circuit detects a second target level distribution, and wherein the second target level distribution is smaller than the first target level distribution.

18. The semiconductor system of claim 15, wherein the discharge circuit comprises:
a control signal generation unit configured to generate a discharge control signal based on the voltage detection signal; and
a discharge unit configured to couple a node of the first power voltage to a node of a ground voltage based on the discharge control signal.

* * * * *